(12) United States Patent
Iwawaki et al.

(10) Patent No.: US 8,790,795 B2
(45) Date of Patent: Jul. 29, 2014

(54) 6,12-DINAPHTHYLCHRYSENE DERIVATIVE AND ORGANIC LIGHT-EMITTING DEVICE USING THE DERIVATIVE

(75) Inventors: Hironobu Iwawaki, Yokohama (JP); Hiroki Ohrui, Kawasaki (JP); Yuko Chishina, Tokyo (JP); Masanori Muratsubaki, Hachioji (JP); Tetsuo Takahashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 264 days.

(21) Appl. No.: 13/480,608

(22) Filed: May 25, 2012

(65) Prior Publication Data
US 2012/0313083 A1 Dec. 13, 2012

(30) Foreign Application Priority Data
Jun. 8, 2011 (JP) ................................ 2011-128251

(51) Int. Cl.
H01L 51/54 (2006.01)
C07D 235/18 (2006.01)
C07D 498/04 (2006.01)

(52) U.S. Cl.
USPC ........... 428/690; 428/917; 313/504; 313/506; 546/115; 548/310.7; 257/40

(58) Field of Classification Search
None
See application file for complete search history.

(56) References Cited

U.S. PATENT DOCUMENTS

| | | | |
|---|---|---|---|
| 6,878,469 B2 | 4/2005 | Yoon et al. | |
| 7,875,368 B2 | 1/2011 | Ohrui et al. | |
| 8,253,126 B2 | 8/2012 | Kang et al. | |
| 2003/0165715 A1 | 9/2003 | Yoon et al. | |
| 2007/0102698 A1 | 5/2007 | Kang et al. | |
| 2010/0117063 A9 | 5/2010 | Kang et al. | |
| 2010/0252823 A1 | 10/2010 | Kambe et al. | |
| 2011/0279025 A1 | 11/2011 | Kosuge et al. | |
| 2012/0306727 A1* | 12/2012 | Ohrui et al. | ...................... 345/76 |

FOREIGN PATENT DOCUMENTS

| | | |
|---|---|---|
| JP | 2010-241687 A | 10/2010 |
| WO | 2009/008353 A | 1/2009 |
| WO | 2010107037 A | 9/2010 |

OTHER PUBLICATIONS

European Communication issued in counterpart application No. 12170942.2 dated Sep. 7, 2012—6 pages.
S. Takizawa, et al., "Phenylbenzimidazole-Based New Bipolar Host Materials for Efficient Phosphorescent Organic Light-Emitting Diodes", Chem. Mater., vol. 21, pp. 2452-2458 (2009).
U.S. Appl. No. 13/461,276, filed May 1, 2012.
Chinese Office Action issued in counterpart application No. 201210186024.1 dated Mar. 28, 2014, along with its English-language translation—15 pages.

* cited by examiner

*Primary Examiner* — Dawn Garrett
(74) *Attorney, Agent, or Firm* — Fitzpatrick, Cella, Harper & Scinto

(57) ABSTRACT

Provided are an organic compound having high heat stability suitable for use in an organic light-emitting device, and an organic light-emitting device using the organic compound. The organic light-emitting device is an organic light-emitting device, including: an anode; a cathode; and an organic compound layer disposed between the anode and the cathode, in which at least one layer of the organic compound layer has a 6,12-dinaphthylchrysene derivative represented by one of the following general formulae (1) and (2):

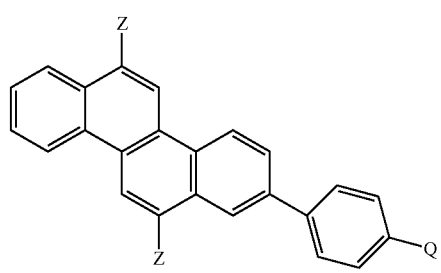
[1]
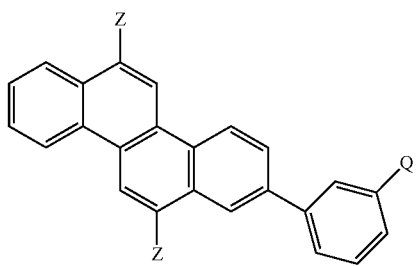
[3]
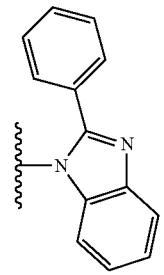
Q =
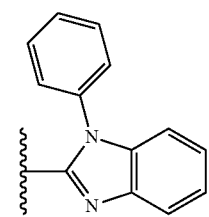
[4]
[2]
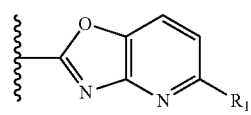
[5]
in the formulae (1) and (2), Z represents a naphthyl group, and Q represents an electron-withdrawing substituent selected from the group consisting of the following general formulae (3) to (5):
in the formula (5), $R_1$ represents a hydrogen atom or a methyl group.
8 Claims, 1 Drawing Sheet

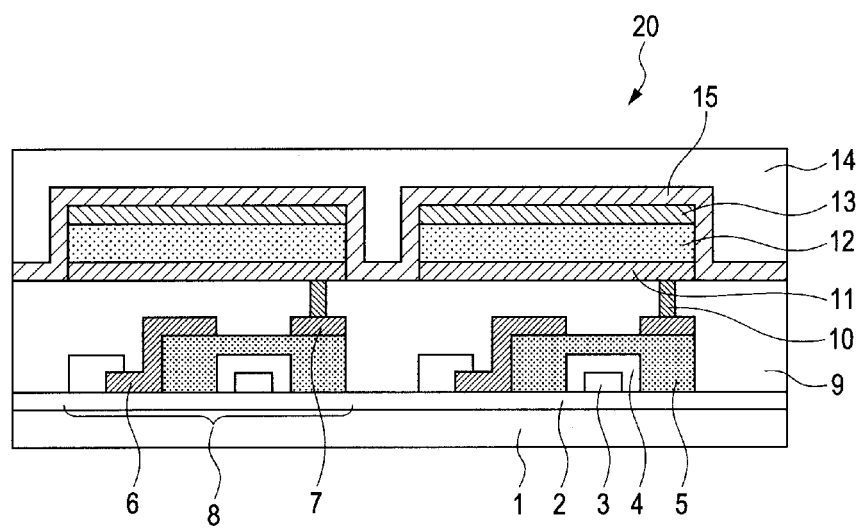

6,12-DINAPHTHYLCHRYSENE DERIVATIVE AND ORGANIC LIGHT-EMITTING DEVICE USING THE DERIVATIVE

BACKGROUND OF THE INVENTION

1. Field of the Invention

The present invention relates to a 6,12-dinaphthylchrysene derivative and an organic light-emitting device using the derivative.

2. Description of the Related Art

An organic light-emitting device is an electronic device in which a thin film containing a fluorescent or phosphorescent organic compound is interposed between a pair of electrodes. When an electron and a hole are injected from the respective electrodes, an exciton of the fluorescent or phosphorescent compound is produced, and the organic light-emitting device emits light upon return of the exciton to its ground state.

Recent advances in the organic light-emitting device are remarkable, and have resulted in the following features, for example. That is, the organic light-emitting device emits light having high luminance at a low applied voltage and a variety of emission wavelengths, has high-speed responsiveness, and allows a light emitting device to be reduced in thickness and weight. This suggests that the organic light-emitting device can be used for a wide range of applications.

By the way, one of the physical properties requested of a component for the organic light-emitting device is the durability of the component itself. The design and research of a compound in consideration of the durability have been vigorously conducted at present. An organic compound described in, for example, Japanese Patent Application Laid-Open No. 2010-241687 or International Application No. WO2009/008353 has been proposed as a specific example of the compound.

However, the organic compound proposed in Japanese Patent Application Laid-Open No. 2010-241687 or International Application No. WO2009/008353 and an organic light-emitting device using the compound still have room for improvement from the viewpoint of their commercialization. Specifically, the compound and the device still have room for improvement from the viewpoint of durability, and their commercialization requires the following items:

(i) additional lengthening of a lifetime at the time of continuous driving; and (ii) measures against, for example, degradation due to heat which are requested when long-term use under a high temperature is assumed.

In addition, when its application to a full-color display or the like is assumed, the organic light-emitting device needs to continuously maintain its initial characteristics in terms of its color purity and efficiency even under, for example, such conditions that the device is used at a high temperature for a long time period. However, it is still unable to say that those problems have been sufficiently solved.

Therefore, an organic light-emitting device having high heat resistance and a material for realizing the device have been particularly requested.

SUMMARY OF THE INVENTION

The present invention has been accomplished to solve such problems of the prior art as described above. Here, an object of the present invention is to provide an organic compound having high heat stability suitable for use in an organic light-emitting device, and an organic light-emitting device using the organic compound.

A 6,12-dinaphthylchrysene derivative of the present invention includes a compound represented by one of the following general formulae (1) and (2):

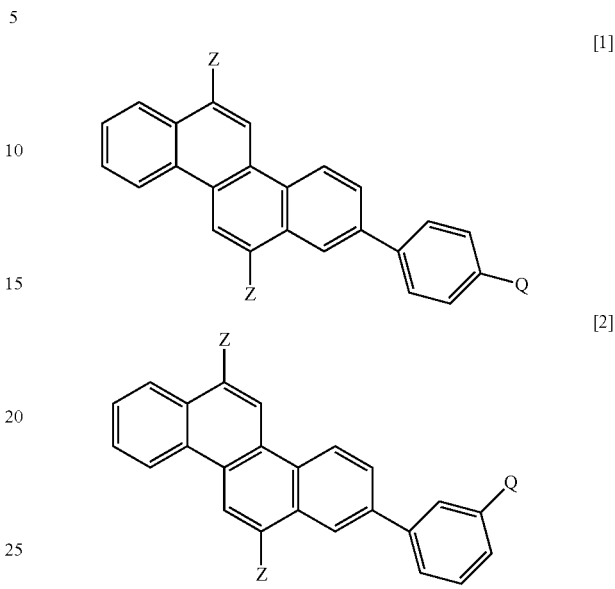

in which in the formulae (1) and (2), Z represents a naphthyl group, and Q represents an electron-withdrawing substituent selected from the group consisting of the following general formulae (3) to (5):

Q =

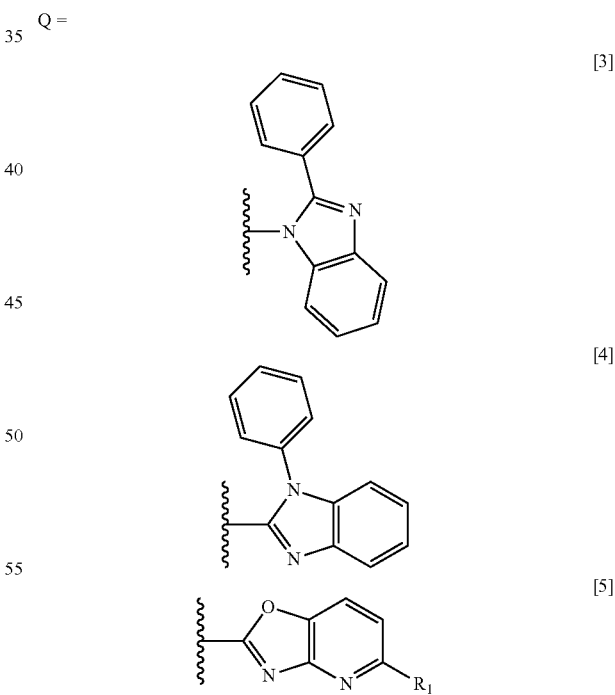

in which in the formula (5), $R_1$ represents one of a hydrogen atom and a methyl group.

According to the present invention, it is possible to provide an organic compound having high heat stability suitable for use in an organic light-emitting device, and an organic light-emitting device using the organic compound. That is, an organic light-emitting device that brings together both a wide band gap and a high glass transition temperature, and is excellent in durability can be provided by using the 6,12-dinaphthylchrysene derivative of the present invention as a component for the organic light-emitting device.

Further features of the present invention will become apparent from the following description of exemplary embodiments with reference to the attached drawing.

BRIEF DESCRIPTION OF THE DRAWING

FIG. 1 is a schematic sectional view illustrating an example of a display apparatus having an organic light-emitting device of the present invention and a TFT element as an example of a switching element to be electrically connected to the organic light-emitting device.

DESCRIPTION OF THE EMBODIMENTS

Hereinafter, the present invention is described in detail. First, a 6,12-dinaphthylchrysene derivative of the present invention is described. The 6,12-dinaphthylchrysene derivative of the present invention is a compound represented by the following general formula (1) or (2).

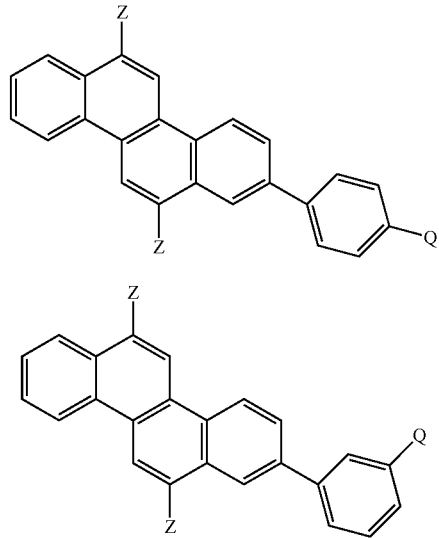

In the formulae (1) and (2), Z represents a naphthyl group.

In the formulae (1) and (2), Q represents an electron-withdrawing substituent selected from the group consisting of the following general formulae (3) to (5):

Q =

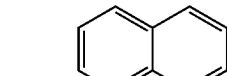

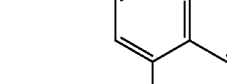

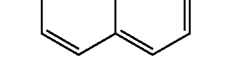

In the formula (5), $R_1$ represents a hydrogen atom or a methyl group.

A 6,12-dinaphthylchrysene derivative of the present invention is preferably a compound selected from the group consisting of the following general formulae (6) to (9):

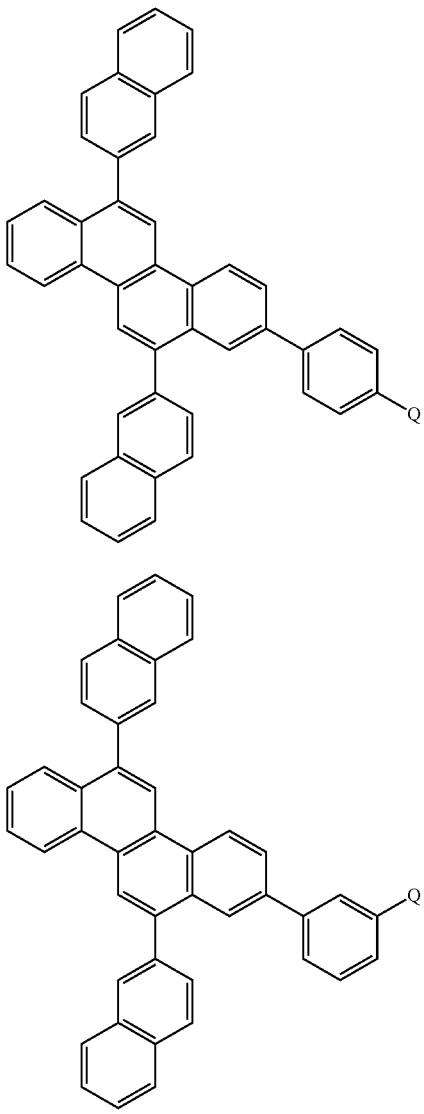

In the formulae (6) to (9), Z represents a naphthyl group.

In the formulae (6) to (9), Q represents an electron-withdrawing substituent selected from the group consisting of the formulae (3) to (5).

(Discussion on Compound)

Hereinafter, the 6,12-dinaphthylchrysene derivative of the present invention is described in more detail.

An improvement in the heat stability of a component for an organic light-emitting device is generally desired for enabling the organic light-emitting device to maintain stable light emission (a stable driving state of the device) upon its continuous driving under a high temperature. Specifically, an increase in its glass transition temperature is desired.

Here, various factors are conceivable as main factors involved in the glass transition temperature of the component. Of those, the following factors (a) and (b) are particularly important:
(a) a chemical structure; and
(b) a molecular weight.

With regard to the factor (a), a reduction in the symmetry of an entire molecular structure is important. This results from the fact that among compounds having the same molecular weight, a compound having lower symmetry tends to have a higher glass transition temperature. In addition, in the case of a compound to be generally categorized as a low-molecular weight compound like the 6,12-dinaphthylchrysene derivative of the present invention, a method of controlling the steric structure of a molecule itself thereof is limited owing to the emergence of a restraint in terms of its molecular weight. Here, in the 6,12-dinaphthylchrysene derivative of the present invention, naphthyl groups are introduced into the 6-position and 12-position of its chrysene skeleton. As a result, steric hindrance occurs between a hydrogen atom bonded to the 1-position (and 3-position) or 2-position of each naphthyl group, and hydrogen atoms bonded to the carbon atoms at the 7-position and 1-position of the chrysene skeleton. The steric hindrance precludes the existence of the naphthyl group and the chrysene skeleton on the same plane, and hence the symmetry of the entire molecular structure can be reduced.

In addition, with regard to the factor (a), it is important that a heteroatom such as O or N except a carbon atom and a hydrogen atom be introduced into at least one substituent out of the substituents constituting the molecule. Here, in the 6,12-dinaphthylchrysene derivative of the present invention, a substituent containing a nitrogen atom or an oxygen atom, specifically a substituent represented by any one of the formulae (3) to (5) is introduced into the 2-position of the chrysene skeleton. As a result, an entire molecule of the 6,12-dinaphthylchrysene derivative of the present invention has polarity. In addition, the glass transition temperature of the compound increases by virtue of the polarity.

With regard to the factor (b), it is important that the molecular weight be increased to the extent possible. This is because the glass transition temperature tends to increase as the molecular weight becomes larger. It is generally said that as a temperature increases, the mobility of a molecule is improved and hence the molecule starts to move more freely. Here, the following tendency is said to exist. As its molecular weight increases, the molecule itself becomes heavier, and the weight of the molecule itself hinders the free movement of the molecule to increase its glass transition temperature. It should be noted that when the molecular weight is increased, attention must be paid so that requirements for the component for the organic light-emitting device may be satisfied. In particular, physical property requirements typified by, for example, a band gap and an ionization potential serve as physical property requirements that cannot be neglected. Therefore, molecular design in consideration of those requirements is important.

Here, in the 6,12-dinaphthylchrysene derivative of the present invention, naphthyl groups are introduced into the carbon atoms at the 6-position and 12-position of the chrysene skeleton as a basic skeleton, and a phenylene group having a specific substituent (substituent represented by any one of the formulae (3) to (5)) is introduced into the carbon atom at the 2-position thereof. As a result, the derivative is of such a structure that the physical property requirements (such as a band gap and an ionization potential) are satisfied while its molecular weight is increased.

The higher a glass transition temperature requested of a compound to be used as a material for an organic light-emitting device, the better. This is because as long as the glass transition temperature is high, the organic light-emitting device can be stably driven without reductions in its device characteristics even when the device is driven under a high temperature. That the glass transition temperature is high as described above is a physical property requirement common to the respective layers constructing the organic light-emitting device which are constituted of different materials and separated from each other in function. It can be said that the glass transition temperature is a particularly important physical property requirement in an electron injection-transport layer or a hole/exciton blocking layer between a light-emitting layer (hereinafter, referred to as "emission layer") and a cathode out of the layers. This is because of the following reason. It is the electron injection-transport layer or the hole/exciton blocking layer that is apt to be directly affected by a heating process for the cathode typified by, for example, a vapor deposition method or a sputtering method during processes for producing an organic EL display, and hence a material for constituting any such layer needs to have a high glass transition temperature. In addition, after the formation of the cathode, a solid sealing film is formed by heating in some cases. As the temperature for such heating process may be higher than that in the case where the organic material is deposited from the vapor by heating, the component for the organic light-emitting device needs to have high heat stability. In view of the foregoing, among others, the electron injection-transport layer needs to be a layer having heat stability comparable to or higher than that of the emission layer or a hole injection-transport layer.

By the way, the light emission of the organic light-emitting device occurs particularly in the emission layer out of the organic compound layer. When the emission layer is formed of a host and a guest that are carrier transportable, main processes leading to light emission are formed of the following processes:

1. the transportation of an electron or a hole in the emission layer;
2. the production of an exciton of the host;
3. the transfer of excitation energy between host molecules; and
4. the movement of the excitation energy from the host to the guest.

Desired energy movement in each process and the light emission occur in competition with various deactivation processes. Needless to say, an improvement in the emission efficiency of an organic light-emitting device requires an increase in the emission quantum yield of its emission center material itself. However, how efficiently energy movement between a host molecule and another host molecule or between the host and the guest can be performed also largely counts. In particular, the physical properties of a hole transport layer or an electron transport layer, or in some cases an electron-exciton blocking layer or the hole/exciton blocking layer, contacting the emission layer largely contribute to the emission efficiency. For example, the ionization potential of a component for the electron transport layer or hole/exciton blocking layer disposed between the emission layer and the cathode must be deeper than those of the host and the guest in the emission layer.

If the ionization potential is shallow, a hole in the emission layer leaks to the electron transport layer or the hole/exciton blocking layer. As a result, the efficiency with which the hole is trapped in the emission layer reduces, thereby causing a reduction in the efficiency with which an exciton of the host is produced in the "production of an exciton of the host." In addition, it is important that the band gap of the component be wider than that of the host in the emission layer. This is because of the following reason. When the band gap is narrower than that of the host, after the movement of the excitation energy from the host to the guest in the "movement of the excitation energy from the host to the guest," the movement of the excitation energy from the host to the electron transport layer or the hole/exciton blocking layer is preferentially caused. The movement of the excitation energy to the electron transport layer or the hole/exciton blocking layer causes the reduction of the emission efficiency. The ionization potential and the band gap in the organic light-emitting device need to be set with reference to a blue emission layer having a deeper ionization potential and a wider band gap than those of a red emission layer and a green emission layer. In this case, a blue light emitting material in the blue emission layer generally has an emission peak at 430 nm to 480 nm. In particular, a blue light emitting material having a good color purity has an emission peak at 440 nm to 460 nm. Therefore, the component for, in particular, the electron transport layer or the hole/exciton blocking layer preferably has an ionization potential deeper than 6.10 eV and a band gap wider than 3.00 eV.

Here, as described above, the 6,12-dinaphthylchrysene derivative of the present invention is such that naphthyl groups are introduced into the carbon atoms at the 6-position and 12-position of the chrysene skeleton as a basic skeleton, and a phenylene group having a specific substituent is introduced into the carbon atom at the 2-position thereof. The inventors of the present invention have found that the derivative has the following characteristics (A) to (C) as a result of the foregoing:

(A) a high glass transition temperature;
(B) a deep ionization potential; and
(C) a wide band gap.

This enables the device to be driven at a low voltage, to maintain high luminance for a long time period, and to be reduced in the extent of degradation due to energization without depending on a combination of the compound with any one of the various hosts and guests.

The present invention has been made by performing molecular design based on the foregoing discussion.

Hereinafter, specific examples of the structural formula of the 6,12-dinaphthylchrysene derivative of the present invention are shown, provided that these merely show specific examples and the present invention is not limited thereto.

Compound Example 1

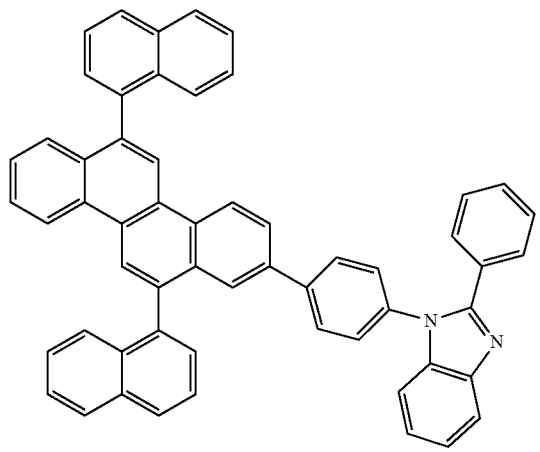

[A11]

[A12]
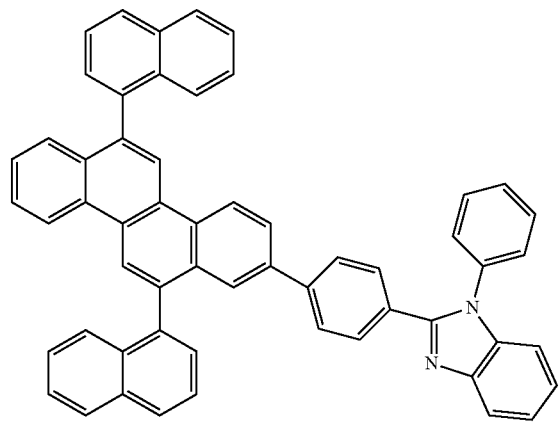
[A13]
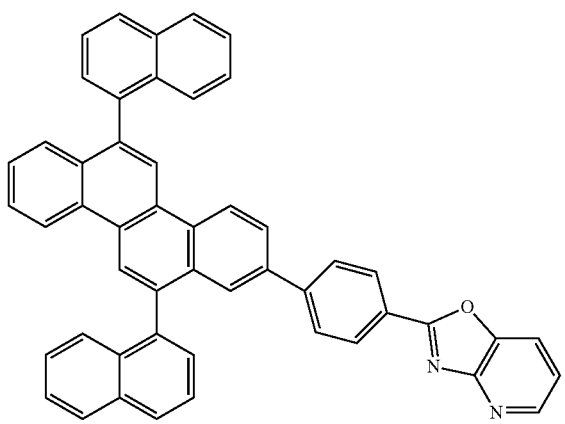
[A14]
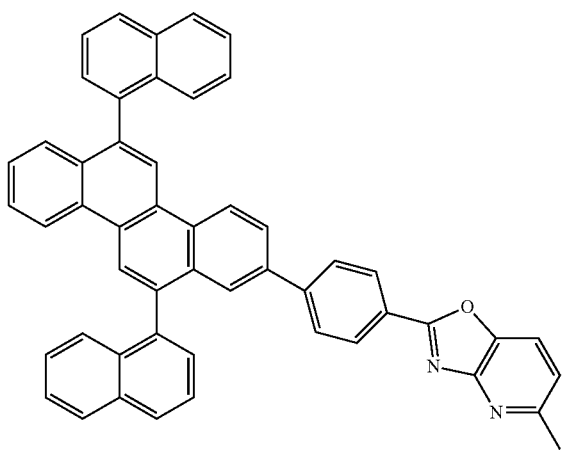
Compound Example 2
[A21]
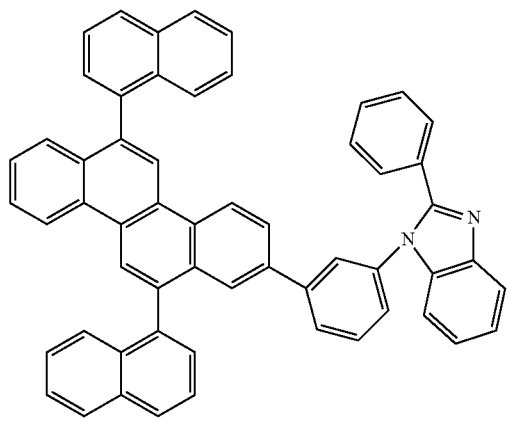
[A22]
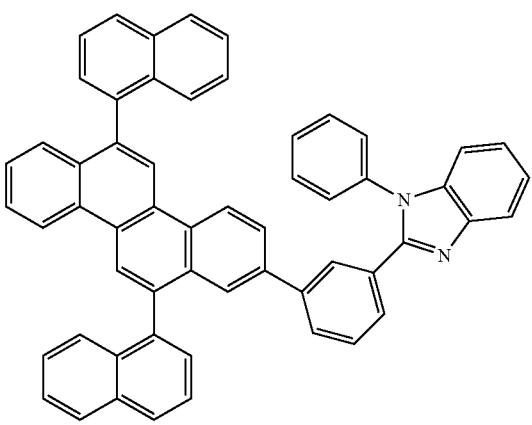
[A23]
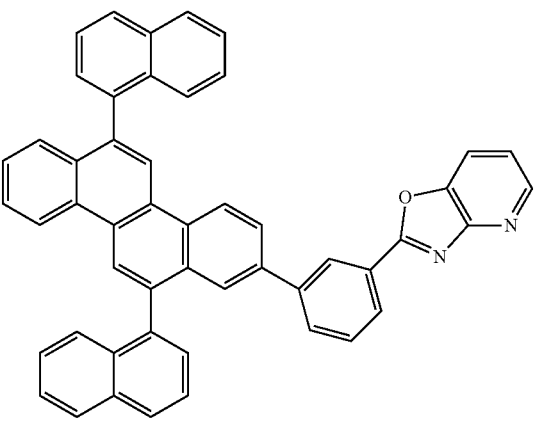

[A24]
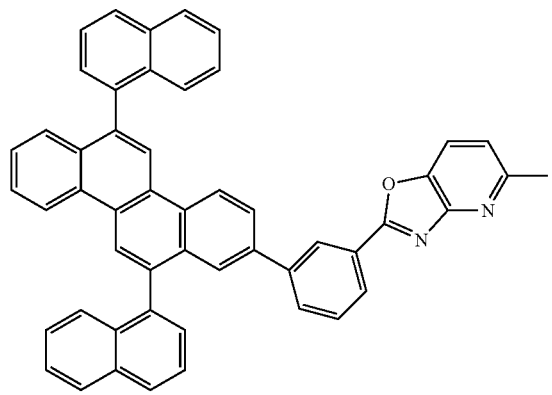
Compound Example 3
[B11]
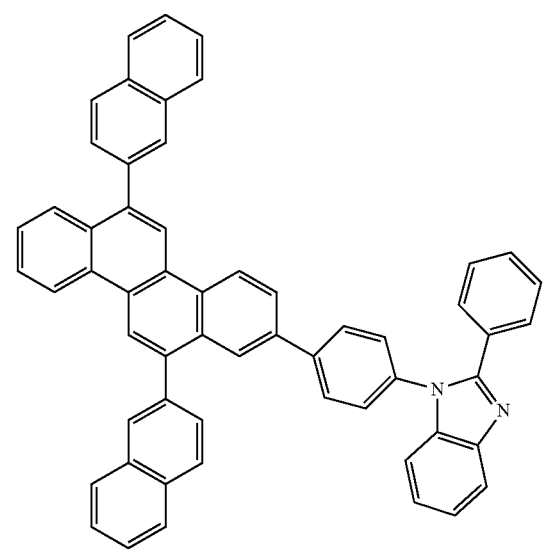
[B12]
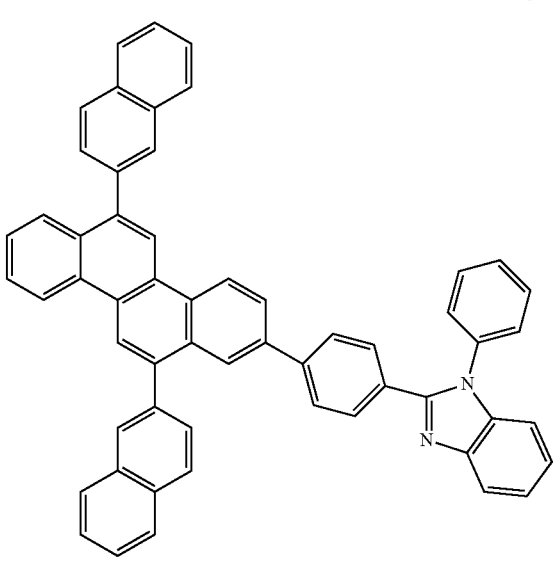
[B13]
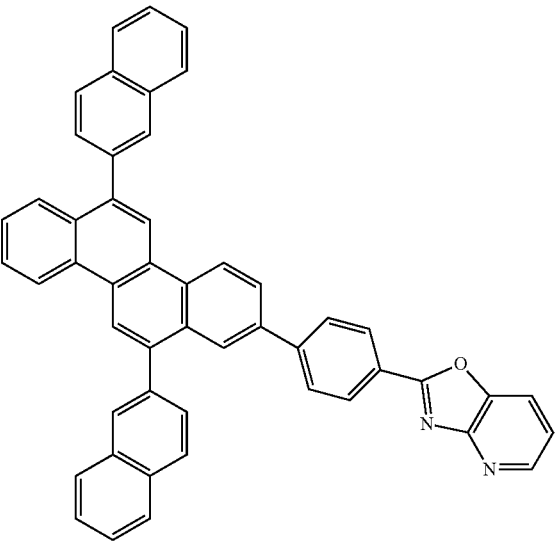
[B14]
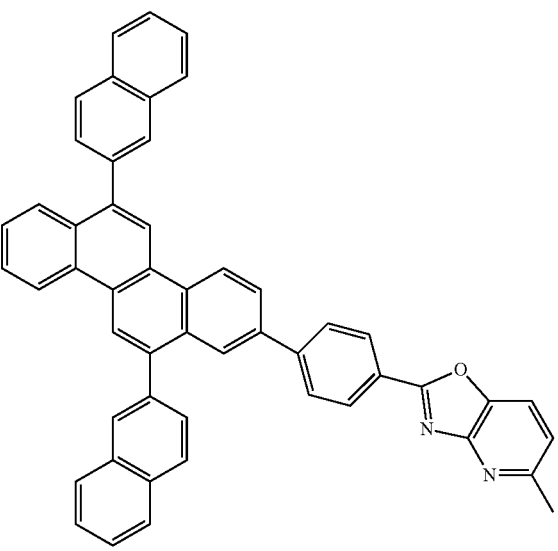

Compound Example 4

[B21]
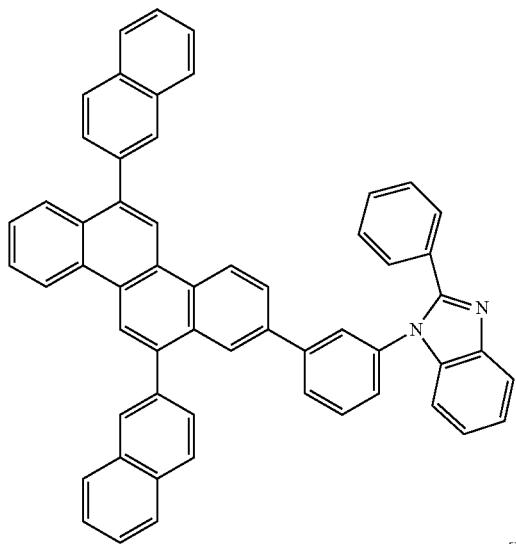

[B22]
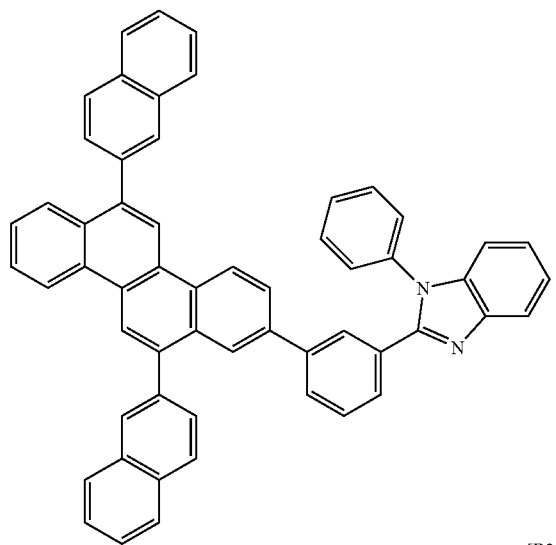

[B23]
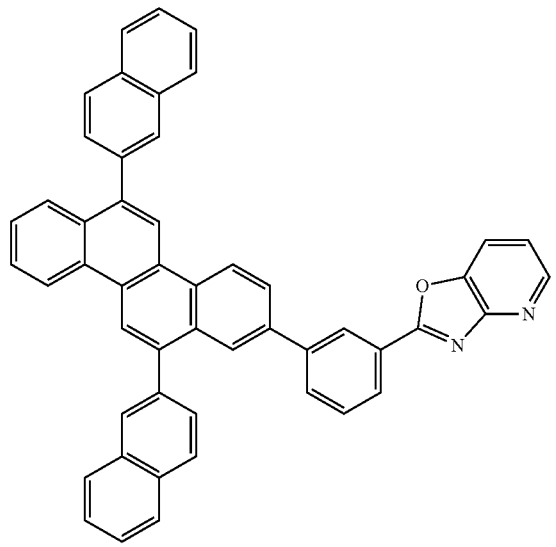

[B24]
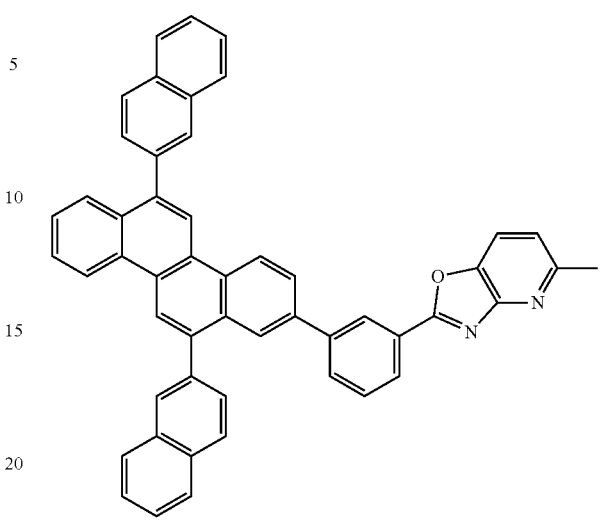

(Organic Light-Emitting Device)

Next, an organic light-emitting device of the present invention is described. The organic light-emitting device of the present invention has an anode and a cathode, and an organic compound layer disposed between the anode and the cathode. Here, the organic compound layer is a single layer or a laminate formed of multiple layers, and in the present invention, at least one layer of the organic compound layer has the 6,12-dinaphthylchrysene derivative of the present invention.

The organic compound layer constructing the organic light-emitting device of the present invention is a single layer, or a laminate formed of multiple layers, including at least an emission layer. When the organic compound layer is a laminate constructed of multiple layers, the organic compound layer is a laminate having any one of, for example, a hole injection layer, a hole transport layer, a hole/exciton blocking layer, an electron transport layer, and an electron injection layer as well as the emission layer.

In the organic light-emitting device of the present invention, such a mode that the organic compound layer constructing the device has an emission layer disposed between the anode and the cathode, and an electron transport layer disposed between the emission layer and the cathode is preferred. When the organic compound layer has the emission layer and the electron transport layer as described above, the 6,12-dinaphthylchrysene derivative of the present invention is incorporated into the electron transport layer.

In the organic light-emitting device of the present invention, such a mode that the organic compound layer constructing the device further has, in addition to the emission layer and the electron transport layer, a hole/exciton blocking layer disposed between the emission layer and the electron transport layer is also preferred. When the organic compound layer has the emission layer, the hole/exciton blocking layer, and the electron transport layer as described above, the 6,12-dinaphthylchrysene derivative of the present invention is incorporated into the hole/exciton blocking layer.

Specific examples of the organic light-emitting device of the present invention are described below:

(i) (anode/)emission layer(/cathode);

(ii) (anode/)hole transport layer/electron transport layer(/cathode);

(iii) (anode/)hole transport layer/emission layer/electron transport layer(/cathode);
(iv) (anode/)hole injection layer/hole transport layer/emission layer/electron transport layer(/cathode);
(v) (anode/)hole transport layer/emission layer/hole-exciton blocking layer/electron transport layer(/cathode); and
(vi) (anode/)hole injection layer/hole transport layer/emission layer/hole-exciton blocking layer/electron transport layer(/cathode).

It should be noted that the foregoing constructions (i) to (vi) merely show specific examples of a very basic element construction, and the construction of the organic compound layer in the organic light-emitting device of the present invention is not limited thereto.

In addition, the 6,12-dinaphthylchrysene derivative of the present invention may be incorporated into the emission layer. Here, when the 6,12-dinaphthylchrysene derivative of the present invention is incorporated into the emission layer, the emission layer may be constituted only of the 6,12-dinaphthylchrysene derivative of the present invention, or may be constituted of a host and a guest. In addition, when the emission layer is constituted of the host and the guest, the 6,12-dinaphthylchrysene derivative of the present invention can be used as the guest.

Here, when the 6,12-dinaphthylchrysene derivative of the present invention is used as the guest, the concentration of the guest to the host is preferably 0.1 wt % or more and 30 wt % or less, more preferably 0.5 wt % or more and 10 wt % or less.

In the organic light-emitting device of the present invention, in addition to the 6,12-dinaphthylchrysene derivative of the present invention, as necessary, conventionally known low-molecular and high-molecular materials may be used. Specifically, a hole injecting material, a hole transporting material, a host, an electron injecting material, an electron transporting material, and the like may be used as components in combination with the 6,12-dinaphthylchrysene derivative.

Specific examples of those materials are given below.

The hole injecting material or the hole transporting material is preferably a material having a high hole mobility. Low-molecular and high-molecular materials each having hole injecting performance or hole transporting performance are exemplified by, but of course not limited to, a triarylamine derivative, a phenylenediamine derivative, a stilbene derivative, a phthalocyanine derivative, a porphyrin derivative, poly(vinylcarbazole), poly(thiophene), and other conductive polymers.

Examples of the host include, but of course not limited to, a triarylamine derivative, a phenylene derivative, a fused ring aromatic compound (e.g., a naphthalene derivative, a phenanthrene derivative, a fluorene derivative, a chrysene derivative, an anthracene derivative, or a pyrene derivative), an organic metal complex (e.g., an organic aluminum complex such as tris(8-quinolinolato)aluminum, an organic beryllium complex, an organic iridium complex, or an organic platinum complex), and a polymer derivative such as a poly(phenylenevinylene) derivative, a poly(fluorene) derivative, a poly(phenylene) derivative, a poly(thienylenevinylene) derivative, or a poly(acetylene) derivative.

The hole/exciton blocking layer is preferably constituted of a material that establishes a balance between the hole mobility of the hole injecting material or the hole transporting material and the electron mobility of the electron injecting material or the electron transporting material, and has high hole blocking performance and high exciton blocking performance.

The electron injecting material or the electron transporting material is selected in consideration of, for example, a balance with the hole mobility of the hole injecting material or the hole transporting material. A material having electron injecting performance or electron transporting performance is exemplified by, but of course not limited to, a fused ring aromatic compound (e.g., a naphthalene derivative, a phenanthrene derivative, a fluorene derivative, a chrysene derivative, an anthracene derivative, or a pyrene derivative), an oxadiazole derivative, an oxazole derivative, a pyrazine derivative, a triazole derivative, a triazine derivative, a quinoline derivative, a quinoxaline derivative, a phenanthroline derivative, and an organic aluminum complex.

It is recommended that a component for an anode have as large a work function as possible. Examples thereof include metal elements such as gold, platinum, silver, copper, nickel, palladium, cobalt, selenium, vanadium, and tungsten, or alloys of those metal elements, and metal oxides such as tin oxide, zinc oxide, indium oxide, indium tin oxide (ITO), and indium zinc oxide. Further, conductive polymers such as polyaniline, polypyrrole, and polythiophene may also be used. One kind of those electrode substances may be used alone, or multiple kinds thereof may be used in combination. Further, the anode may be constructed of a single layer or may be constructed of multiple layers.

Meanwhile, it is recommended that a component for a cathode have a small work function. Examples of the component include alkali metals such as lithium, alkaline earth metals such as calcium, and metal elements such as aluminum, titanium, manganese, silver, lead, and chromium. Alternatively, alloys including combinations of those metal elements may also be used. For example, magnesium-silver, aluminum-lithium, aluminum-magnesium, and the like may be used. Metal oxides such as indium tin oxide (ITO) may also be utilized. One kind of those electrode substances may be used alone, or multiple kinds thereof may be used in combination. Further, the cathode may be constructed of a single layer or may be constructed of multiple layers.

In the organic light-emitting device according to this embodiment, a layer including the organic compound according to this embodiment and any other layer formed of an organic compound are formed by the following method. In general, a layer is formed by a vacuum vapor deposition method, an ionization vapor deposition method, a sputtering method, or a plasma method. Alternatively, the layer may be formed by dissolving the compound in an appropriate solvent and subjecting the resultant to a known coating method (e.g., a spin coating method, a dipping method, a casting method, an LB method, or an ink jet method). Here, when the layer is formed by a vacuum vapor deposition method, a solution coating method, or the like, the layer is hard to undergo crystallization and the like and is excellent in stability over time. Further, when the film is formed by a coating method, the film may also be formed in combination with an appropriate binder resin.

Examples of the binder resin include, but not limited to, a polyvinylcarbazole resin, a polycarbonate resin, a polyester resin, an ABS resin, an acrylic resin, a polyimide resin, a phenolic resin, an epoxy resin, a silicone resin, and a urea resin. Further, one kind of those binder resins may be used alone as a homopolymer or copolymer, or two or more kinds thereof may be used as a mixture. In addition, a known additive such as a plasticizer, an antioxidant, or an ultraviolet absorber may be used in combination with the binder resin, as necessary.

(Applications of Organic Light-Emitting Device)

The organic light-emitting device according to the present invention may be used as a constituent member for a display apparatus or a lighting equipment. In addition, the device finds applications in, for example, a light source for exposure of an electrophotographic image forming device or a backlight of a liquid crystal display apparatus. Here, when the organic light-emitting device of the present invention is utilized as a constituent member for the lighting equipment, the lighting equipment is provided with, for example, the organic light-emitting device of the present invention and an inverter circuit connected to the organic light-emitting device of the present invention.

In addition, the display apparatus as described above is a device including the organic light-emitting device of the present invention in a display portion. The display portion includes multiple pixels. The pixels each include the organic light-emitting device of the present invention and a switching element such as a TFT element for controlling the emission luminance of the organic light-emitting device of the present invention. Here, when the TFT element is used as the switching element, the anode or the cathode, which is a constituent member for the organic light-emitting device of the present invention, is electrically connected to a drain electrode or a source electrode of the TFT element. It should be noted that the display apparatus may be used as an image display apparatus such as a PC.

The display apparatus includes an image input portion for inputting information from an area CCD, a linear CCD, a memory card, and the like, and may be an image output device for outputting the input image to a display portion. In addition, a display portion included in an image pickup device or an ink jet printer may be provided with both of an image output function, which displays an image based on image information input from the outside, and an input function, which serves as an operation panel and inputs processing information for an image. Further, the display apparatus may be used for a display portion of a multifunction printer, a head-mounted display, or a digital camera.

Next, a display apparatus using the organic light-emitting device of the present invention is described with reference to the drawing.

FIG. 1 is a schematic sectional view illustrating an example of a display apparatus including the organic light-emitting device of the present invention and a TFT element as an example of a switching element electrically connected to the organic light-emitting device. Details of the structure are described below.

The display apparatus 20 of FIG. 1 includes a substrate 1 made of glass or the like and a moisture-proof film 2 for protecting a TFT element or an organic compound layer on the substrate. Further, a gate electrode 3 made of a metal is represented by reference numeral 3, a gate insulating film 4 is represented by reference numeral 4, and a semiconductor layer is represented by reference numeral 5.

A TFT element 8 includes the semiconductor layer 5, a drain electrode 6, and a source electrode 7. An insulating film 9 is provided above the TFT element 8. An anode 11 of the organic light-emitting device is connected to the source electrode 7 via a contact hole (through-hole) 10. It should be noted that the display apparatus of the present invention is not limited to the construction of FIG. 1, and any one of the anode and a cathode has only to be connected to any one of the source electrode and the drain electrode of the TFT element.

In the display apparatus 20 of FIG. 1, an organic compound layer 12 having a single-layer or multi-layer structure is illustrated like a single layer. A first protective layer 14 and a second protective layer 15 for suppressing the degradation of the organic light-emitting device are provided above a cathode 13.

It should be noted that in the display apparatus of the present invention, examples of the switching element constructing the display apparatus include a TFT element, an MIM element, and an MOSFET. In addition, a semiconductor to be used in the switching element is, for example, an oxide semiconductor, single-crystal silicon, or amorphous silicon.

EXAMPLES

Hereinafter, the present invention is described in detail by way of examples. In this regard, however, the present invention is by no means limited thereto.

Synthesis Example 1

Synthesis of Intermediate Compound M1

Intermediate Compound M1 was synthesized in accordance with a synthesis scheme shown below.

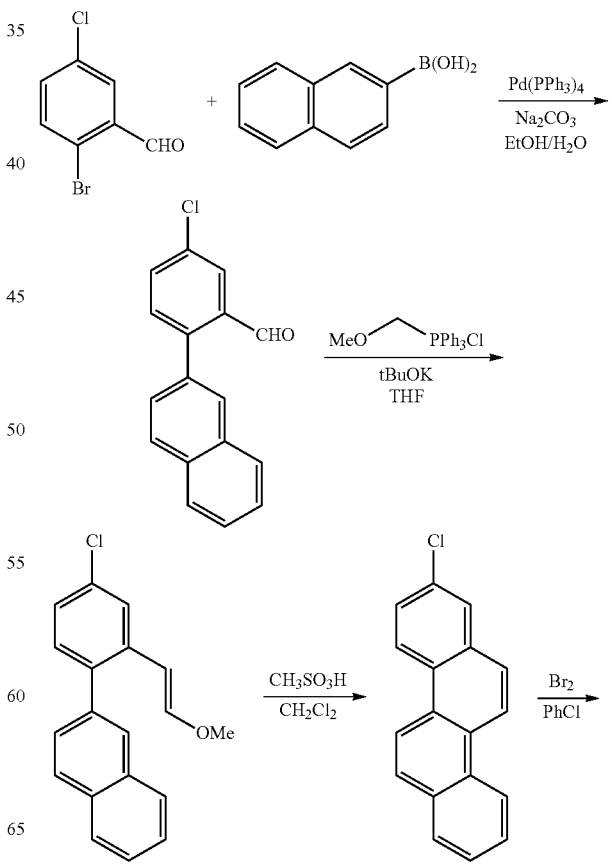

-continued

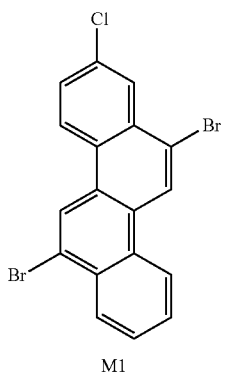

M1

Hereinafter, a specific method of synthesizing Intermediate Compound M1 is described.

(1) First, the following reagents and solvents were loaded into a 2-L reaction vessel.
Ethanol: 500 mL
2-Bromo-5-chlorobenzaldehyde: 50 g (0.23 mol, 1.0 eq)
2-Naphtalene boronic acid: 40 g (0.22 mol, 1.02 eq)
Water: 250 mL
Sodium carbonate: 72.5 g (0.68 mol, 3.0 eq)

Next, the reaction solution was heated to 40° C. while being stirred, and then Pd(PPh$_3$)$_4$ (3.95 g, 3.42 mmol, 0.015 eq) was added to the reaction solution at the liquid temperature (40° C.). Next, the reaction solution was heated to 70° C., and then the reaction solution was stirred at the liquid temperature (70° C.) for 18 hours. After the completion of the reaction, 500 mL of water were added to the reaction solution, and then the mixture was further stirred. A white solid (78.4 g) produced after the stirring was taken by filtration. Next, the raw materials were removed with a short column (filler: silica gel; eluent: toluene), and then the remainder was recrystallized with toluene. Thus, 53.1 g of 5-chloro-2-naphthylbenzaldehyde as a white solid were obtained (yield: 87.4%).

(2) Subsequently, the following reagent and solvent were loaded into a 1-L reaction vessel.
(Methoxymethyl)triphenylphosphonium chloride: 45.5 g (0.13 mol, 1.5 eq)
Dehydrated THF: 400 mL Next, t-BuOK (14.9 g, 0.13 mol, 1.5 eq) was slowly added to the reaction vessel, and then the reaction solution was stirred for 40 minutes. Next, the reaction vessel was immersed in a water bath, and then 5-chloro-2-naphthylbenzaldehyde (23.6 g, 0.088 mol, 1.0 eq) was added to the reaction vessel over 20 minutes. Next, the reaction solution was stirred at room temperature for 1 hour. After the completion of the reaction, water (1 L) and toluene (500 mL) were added to the reaction solution to perform liquid-liquid separation so that an organic layer was recovered. Next, the recovered organic layer was dried with magnesium sulfate and then concentrated under reduced pressure. Thus, a brown oily substance (33.6 g) was obtained. Next, the oily substance was purified by silica gel column chromatography (eluent: heptane/toluene=4/1). Thus, 23.9 g of 2-(4-chloro-2-(2-methoxyvinyl)phenyl)naphthalene in a pale yellow oil state were obtained.

(3) Subsequently, the following reagent and solvent were loaded into a 2-L reaction vessel.
2-(4-Chloro-2-(2-methoxyvinyl)phenyl)naphthalene: 23.9 g (0.081 mol, 1 eq)
Methylene chloride: 600 mL Next, methanesulfonic acid (7.8 g, 0.081 mol, 1 eq) was added to the reaction vessel, and then the reaction solution was stirred at room temperature for 4 hours. After the completion of the reaction, the reaction solution was quenched with MeOH (500 mL). Next, a solid precipitated by the quenching was taken by filtration and then washed with MeOH. After that, the washed product was filtered and dried. Thus, 10.4 g of 2-chlorochrysene as a white solid were obtained (HPLC purity: 99.9%).

Further, the compound thus obtained was identified by 1H-NMR measurement.

(1H-NMR, (400 MHz, CDCl3)) δ 8.74 (d, 1H), 8.72 (d, 1H), 8.67 (d, 1H), 8.61 (d, 1H), 8.00 (d, 1H), 7.98 (dd, 1H), 7.94 (d, 1H), 7.89 (d, 1H), 7.73 (td, 1H), 7.63 (m, 1H)

(4) Next, the following reagent and solvent were loaded into a 200-mL reaction vessel.
2-Chlorochrysene: 3.66 g (0.014 mol, 1 eq)
PhCl: 90 mL Next, the reaction solution was heated to 65° C. Next, pyridine (5.5 mg, 0.069 mmol, 0.005 eq) was added to the reaction solution in a state of being heated to 65° C. Next, a Br2/PhCl mixed solvent (5 M, 5.7 mL, 0.028 mol, 2.15 eq) was dropped to the reaction solution. Next, the completion of the reaction was confirmed. After that, a solid precipitated at the time of the cooling of the reaction solution was taken by filtration. Next, the solid taken by filtration was washed with MeOH (50 mL) and then recrystallized with PhCl. Thus, 4.9 g of Intermediate Compound M1 as a white solid were obtained (yield: 84.7%).

Further, the compound thus obtained was identified by 1H-NMR measurement.

(1H-NMR, (400 MHz, CDCl$_3$)) δ 9.00 (s, 1H), 8.90 (s, 1H), 8.66 (d, 1H), 8.60 (d, 1H), 8.49-8.34 (m, 2H), 7.76-8.72 (m, 3H)

Synthesis Example 2

Synthesis of Intermediate Compound M2

(Synthesis of Intermediate Compounds M2, M3, M4, and M5)

Intermediate Compound M2 was synthesized in accordance with a synthesis scheme shown below. It should be noted that the synthesis scheme shown below is shown in Chemistry of Materials, 21 (12), 2452-2458, 2009.

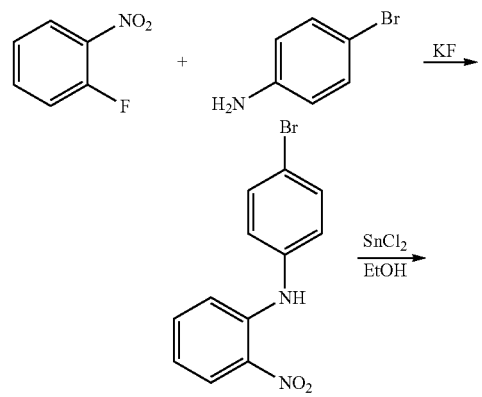

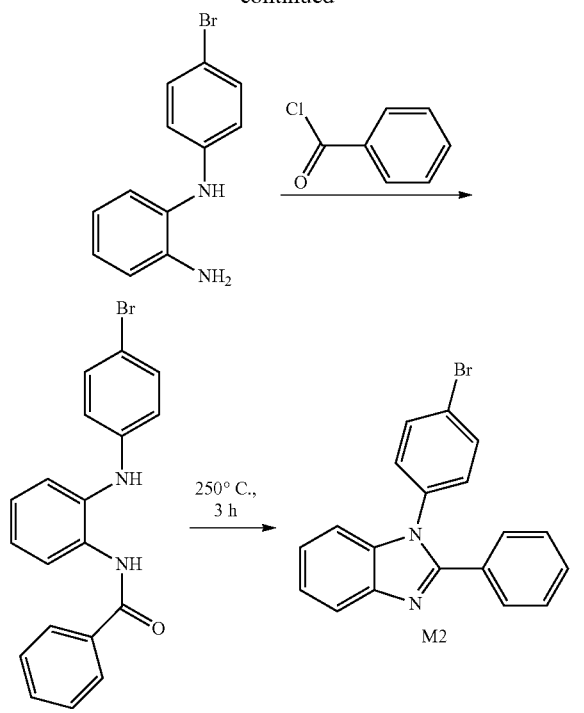

Synthesis Example 3

Synthesis of Intermediate Compound M3

Synthesis was performed by the same method as that in Synthesis Example 2 except that 3-bromoaniline was used instead of 4-bromoaniline as one of the raw materials in Synthesis Example 2. Thus, Intermediate Compound M3 shown below was synthesized.

Synthesis Example 4

Synthesis of Intermediate Compound M4

Synthesis was performed by the same method as that in Synthesis Example 2 except that aniline was used instead of 4-bromoaniline as one of the raw materials, and 4-bromobenzoyl chloride was used instead of benzoyl chloride as one of the raw materials in Synthesis Example 2. Thus, Intermediate Compound M4 shown below was synthesized.

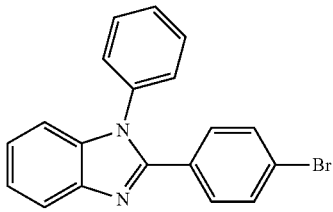

Synthesis Example 5

Synthesis of Intermediate Compound M5

Synthesis was performed by the same method as that in Synthesis Example 2 except that aniline was used instead of 4-bromoaniline as one of the raw materials, and 3-bromobenzoyl chloride was used instead of benzoyl chloride as one of the raw materials in Synthesis Example 2. Thus, Intermediate Compound M5 shown below was synthesized.

Synthesis Example 6

Synthesis of Intermediate Compound M6

Intermediate Compound M6 was synthesized in accordance with a synthesis scheme shown below.

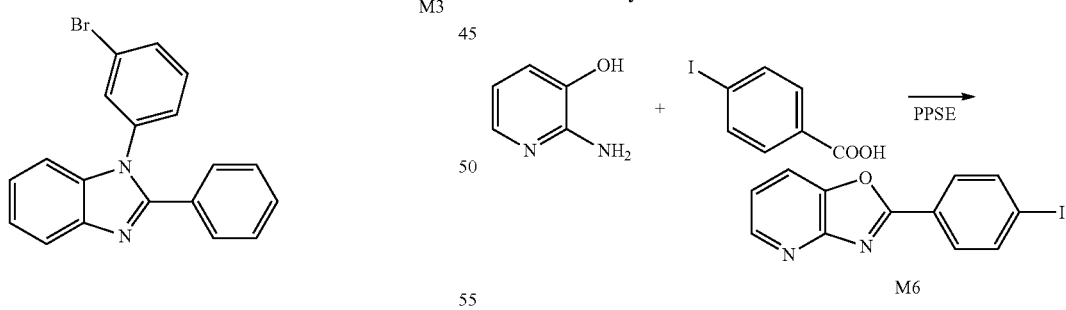

The following reagents and solvent were loaded into a reaction vessel.
2-Amino-3-hydroxypyridine: 9.77 g (0.089 mol, 1.1 eq)
4-Iodobenzoic acid: 20.0 g (0.081 mol, 1.0 eq)
Polyphosphoric acid trimethylsilyl ester: 71.3 g
Next, the reaction solution was heated to 180° C. and then stirred at the temperature (180° C.) for 4 hours. After the completion of the reaction, the reaction solution was left standing to cool. Water (40 mL) and a 10% aqueous solution of sodium hydroxide (320 g) were added to the reaction solution, followed by stirring. After it had been confirmed that the pH of the solution had become 7, filtration was performed. Next, a solid taken by the filtration was dissolved in chloroform, and then water was added to the solution to perform liquid-liquid separation so that an organic layer was recovered. Next, the resultant organic layer was concentrated under reduced pressure. The resultant solid was subjected to slurry washing with methanol twice. Thus, 21.8 g of Intermediate Compound M6 were obtained (yield: 83.9%, purity: 99.78%).

Synthesis Example 7

Synthesis of Intermediate Compound M7

Synthesis was performed by the same method as that in Synthesis Example 6 except that 3-iodobenzoic acid was used instead of 4-iodobenzoic acid in Synthesis Example 6. Thus, Intermediate Compound M7 shown below was synthesized.

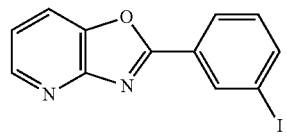

Example 1

Synthesis of Exemplified Compound A11

Intermediate Compound A11 was synthesized in accordance with a synthesis scheme shown below.

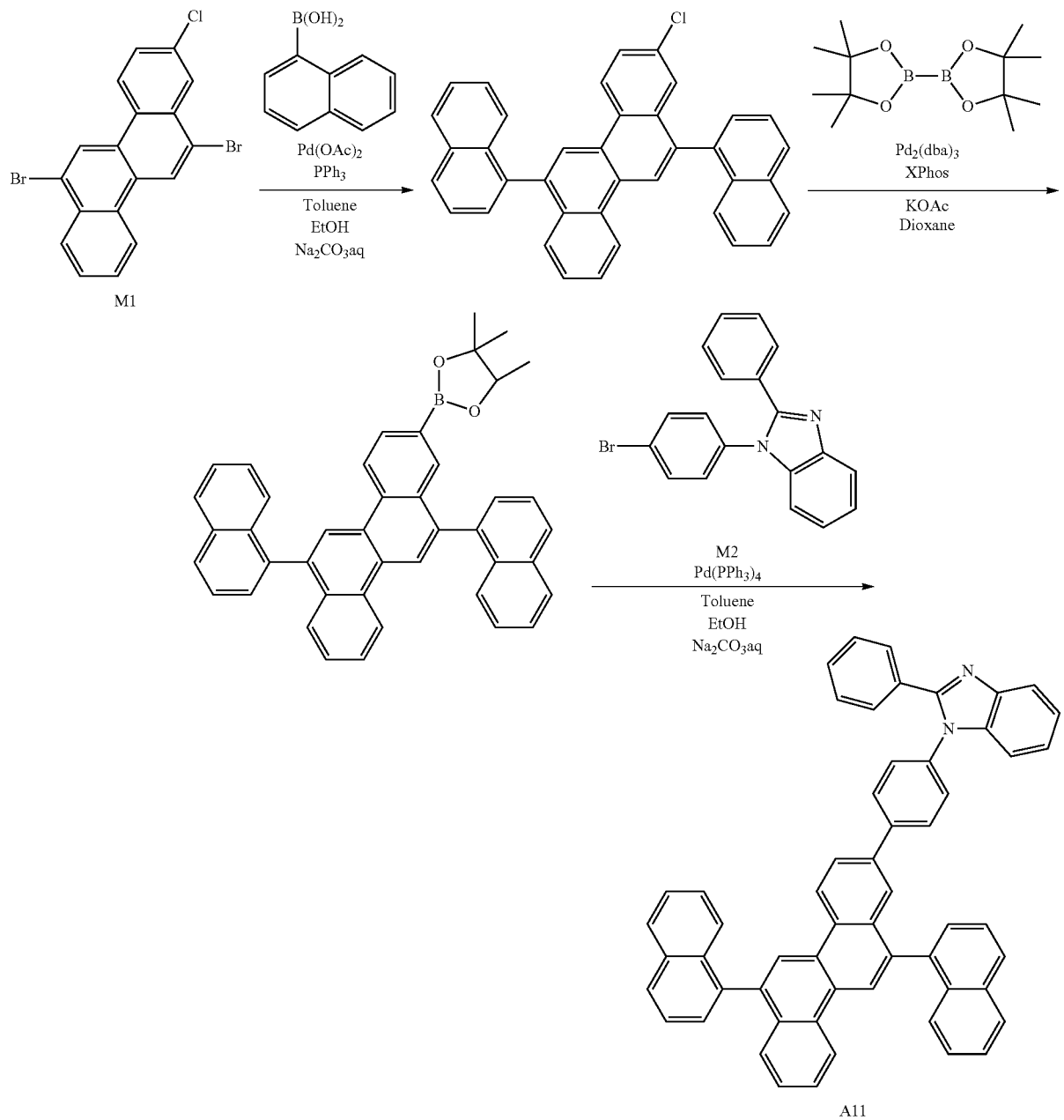

Hereinafter, a specific method of synthesizing Exemplified Compound A11 is described.

(1) First, the following reagents and solvents were loaded into a reaction vessel.
Intermediate compound M1: 16.0 g (0.038 mol, 1.0 eq)
1-Naphtalene boronic acid: 14.1 g (0.082 mol, 2.15 eq)
Toluene: 640 mL
Ethanol: 160 mL
Aqueous sodium carbonate: 160 mL (6.0 eq)

Next, the following reagents were further added while stirring the reaction solution.
Palladium acetate: 256 mg (0.001 mol, 0.03 eq)
Triphenyl phosphine: 2.39 g (0.01 mol, 0.24 eq)

Next, the reaction solution was stirred while being heated and refluxed. After the completion of the reaction, the reaction solution was cooled and filtered. Next, a filtrate obtained by the filtration was subjected to liquid-liquid separation with water three times so that an organic layer was recovered. Next, silica gel (59.9 g) was loaded into the organic layer to perform gel adsorption. Next, a filtrate obtained by separating the silica gel by filtration was concentrated under reduced pressure. Thus, 22.1 g of a coarse product were obtained. Next, the coarse product was subjected to slurry washing with a toluene/heptane mixed solvent and then filtered. Thus, 17.9 g of 2-chloro-6,12-dinaphthylchrysene were obtained (yield: 91.3%, HPLC purity: 99.4%).

(2) Subsequently, the following reagents and solvent were loaded into a reaction vessel.
2-Chloro-6,12-dinaphthylchrysene: 5.0 g (0.01 mol, 1.0 eq)
Bispinacolate diborone: 6.16 g (0.024 mol, 2.5 eq)
Potassium acetate: 2.86 g (0.029 mol, 3.0 eq)
Toluene: 590 mL Next, the following reagents were further added while stirring the reaction solution.
Xphos(2-dicyclohexylphosphino-2',4',6'-triisopropylbiphenyl): 190 mg (0.04 eq)
Tris(dibenzyrideneacetone)diparadium: 180 mg (0.02 eq)

Next, the reaction solution was stirred while being heated and refluxed. After the completion of the reaction, the reaction solution was cooled and filtered. Next, a filtrate obtained by the filtration was subjected to liquid-liquid separation with water so that an organic layer was recovered. Next, silica gel (59.9 g) was loaded into the organic layer to disperse the silica gel. Next, a filtrate obtained by separating the silica gel by filtration was concentrated under reduced pressure. Thus, a coarse product were obtained. Next, methanol was added to the resultant coarse product, and then the coarse product was subjected to slurry washing and filteration. Thus, 5.71 g of 2-pinacolate-6,12-dinaphthylchrysene were obtained (yield: 97.0%, HPLC purity: 99.2%).

(3) Next, the following reagents and solvents were loaded into a reaction vessel.
2-Pinacolate-6,12-dinaphtylchrysene: 2.49 g (5.2 mmol, 1.1 eq)
Intermediate compound M2: 1.66 g (4.7 mmol, 1.0 eq)
Toluene: 75 mL
Aqueous sodium carbonate: 25 mL (3.0 eq)

Next, the following reagents were further added while stirring the reaction solution.
Pd(PPh$_3$)$_4$: 274 mg (0.24 mmol, 0.05 eq)
Ethanol: 25 mL Next, the reaction solution was stirred for 2 hours while being heated and refluxed. After the completion of the reaction, the reaction solution was cooled. Next, liquid-liquid separation was performed with water so that an organic layer was recovered. Next, the resultant organic layer was concentrated under reduced pressure. Thus, a coarse product was obtained. Next, the resultant coarse product was purified by silica gel column chromatography (eluent: toluene/ethyl acetate=10/1), and then a fractionated solution was concentrated under reduced pressure. Thus, a solid was obtained. Next, the resultant solid was subjected to slurry washing with methanol and then filtered. Thus, 2.82 g of Exemplified Compound A11 were obtained (yield: 86.8%, HPLC purity: 99.8%).

Mass spectrometry confirmed 748 as the M$^+$ of the compound.

Further, the compound thus obtained was identified by 1H-NMR measurement.

(1H-NMR, (400 MHz, CDCl3)) δ 8.93 (d, 1H), 8.89 (s, 1H), 8.87 (s, 1H), 8.83 (d, 1H), 8.09-8.01 (m, 4H), 7.94 (dd, 1H), 7.87 (s, 1H), 7.86 (d, 1H), 7.77-7.52 (m, 16H), 7.47-7.23 (m, 9H)

In addition, the physical properties of the compound obtained in this example were measured and evaluated by the following methods.

(A) Glass Transition Temperature

The glass transition temperature of a measuring object was measured with a differential scanning calorimeter (manufactured by NETZSCH, trade name: DSC204F1). Temperature conditions were as described below. The temperature of the object was increased from room temperature to 410° C. at 10° C./min and then held at 410° C. for 10 minutes. After that, the temperature was cooled to 0° C. at 40° C./min and then held at 0° C. for 10 minutes. Next, the temperature was increased from 0° C. to 410° C. at 20° C./min and then held at 410° C. for 10 minutes. After that, the temperature was cooled to room temperature at 40° C./min. The glass transition temperature appearing at the time of the second temperature increase was defined as a measured value. It should be noted that the usage of the compound to be subjected to the measurement was set to 2 mg to 3 mg.

(B) Band Gap

First, the measuring object was deposited from the vapor by heating onto a glass substrate so that a deposited thin film having a thickness of 20 nm was produced. Next, the light absorption spectrum of the deposited thin film was measured with an ultraviolet and visible spectrophotometer (V-560 manufactured by JASCO Corporation). Then, a band gap was calculated from an absorption edge of the resultant light absorption spectrum.

(C) Ionization Potential

A solution prepared by mixing the measuring object and chloroform was applied onto a glass substrate by spin coating, and was then dried so that a thin film having a thickness of 15 nm was obtained. The ionization potential of the thin film was measured with an AC-3 (manufactured by RIKEN KEIKI Co., Ltd.).

Exemplified Compound A11 obtained in this example had a glass transition temperature of 207.2° C., a band gap of 3.33 eV, and an ionization potential of 6.24 eV.

Example 2

Synthesis of Exemplified Compound A13

Exemplified Compound A13 shown below was synthesized by the same method as that in Example 1 except that Intermediate Compound M6 was used instead of Intermediate Compound M2 in Example 1(3).

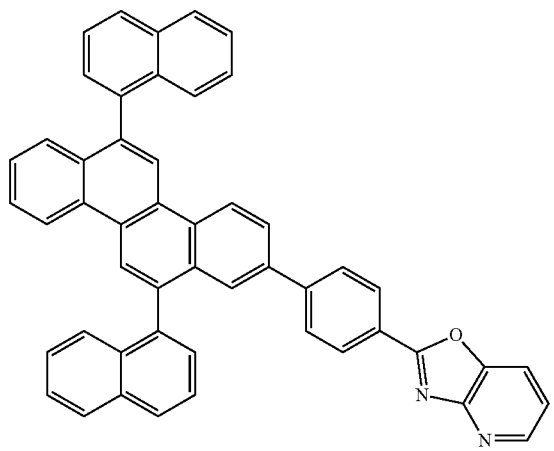

A13

Mass spectrometry confirmed 674 as the M⁺ of the compound.

Further, the compound thus obtained was identified by 1H-NMR measurement.

(1H-NMR, (400 MHz, CDCl3)) δ 8.93 (d, 1H), 8.90 (s, 1H), 8.88 (s, 1H), 8.84 (d, 1H), 8.57 (dd, 1H), 8.27 (d, 2H), 8.09-8.02 (m, 5H), 7.88 (ss, 1H), 7.94 (dd, 1H), 7.76-7.52 (m, 14H), 7.39-7.33 (m, 2H)

In addition, Exemplified Compound A13 obtained in this example had a glass transition temperature of 208.9° C., a band gap of 3.05 eV, and an ionization potential of 6.29 eV.

Example 3

Synthesis of Exemplified Compound A23

Exemplified Compound A23 shown below was synthesized by the same method as that in Example 1 except that Intermediate Compound M7 was used instead of Intermediate Compound M2 in Example 1(3).

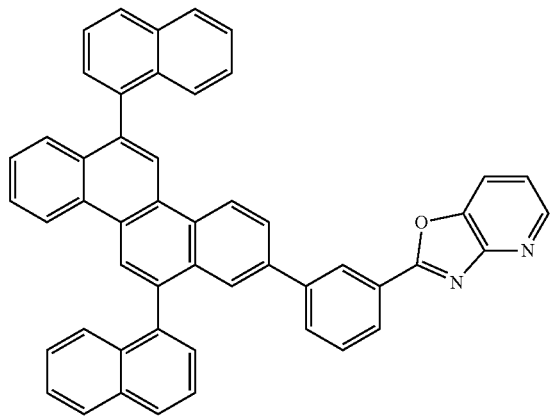

A23

Mass spectrometry confirmed 674 as the M⁺ of the compound.

Further, the compound thus obtained was identified by 1H-NMR measurement.

(1H-NMR, (400 MHz, CDCl3)) δ 8.95 (d, 1H), 8.90 (s, 1H), 8.88 (s, 1H), 8.84 (s, 1H), 8.58 (dd, 1H), 8.45 (s, 1H), 8.23 (d, 2H), 8.09-7.98 (m, 5H), 7.86 (m, 2H), 7.77-7.71 (m, 4H), 7.68-7.33 (m, 11H)

In addition, Exemplified Compound A23 obtained in this example had a glass transition temperature of 192.2° C., a band gap of 3.28 eV, and an ionization potential of 6.23 eV.

Example 4

Synthesis of Exemplified Compound B11

Exemplified Compound B11 shown below was synthesized by the same method as that in Example 1 except that 2-naphtalene boronic acid was used instead of 1-naphtalene boronic acid in Example 1(1).

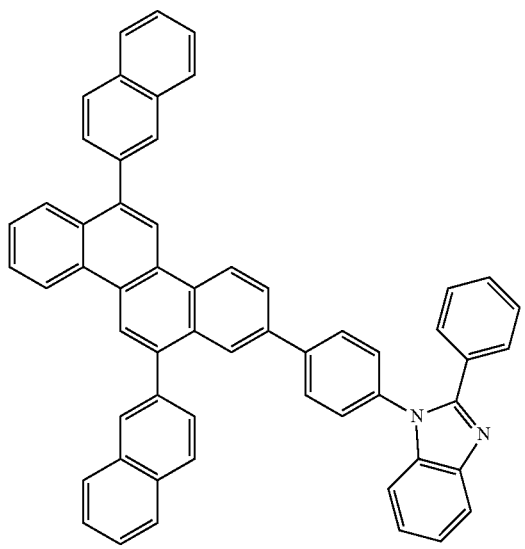

B11

Mass spectrometry confirmed 748 as the M⁺ of the compound.

Further, the compound thus obtained was identified by 1H-NMR measurement.

(1H-NMR, (400 MHz, CDCl3)) δ 9.00 (d, 1H), 8.90 (d, 1H), 8.85 (s, 1H), 8.82 (s, 1H), 8.34 (ss, 1H), 8.20 (s, 1H), 8.17 (s, 1H), 8.09-8.00 (m, 8H), 7.89-7.75 (m, 6H), 7.62-7.59 (m, 7H), 7.36-7.27 (m, 8H)

In addition, Exemplified Compound B11 obtained in this example had a glass transition temperature of 175.4° C., a band gap of 3.06 eV, and an ionization potential of 6.16 eV.

Example 5

Produced in this example was an organic light-emitting device in which an anode, a hole injection layer, a hole transport layer, an emission layer, a hole/exciton blocking layer, an electron transport layer, and a cathode were sequentially formed on a substrate. Hereinafter, part of the materials used in this example are shown.

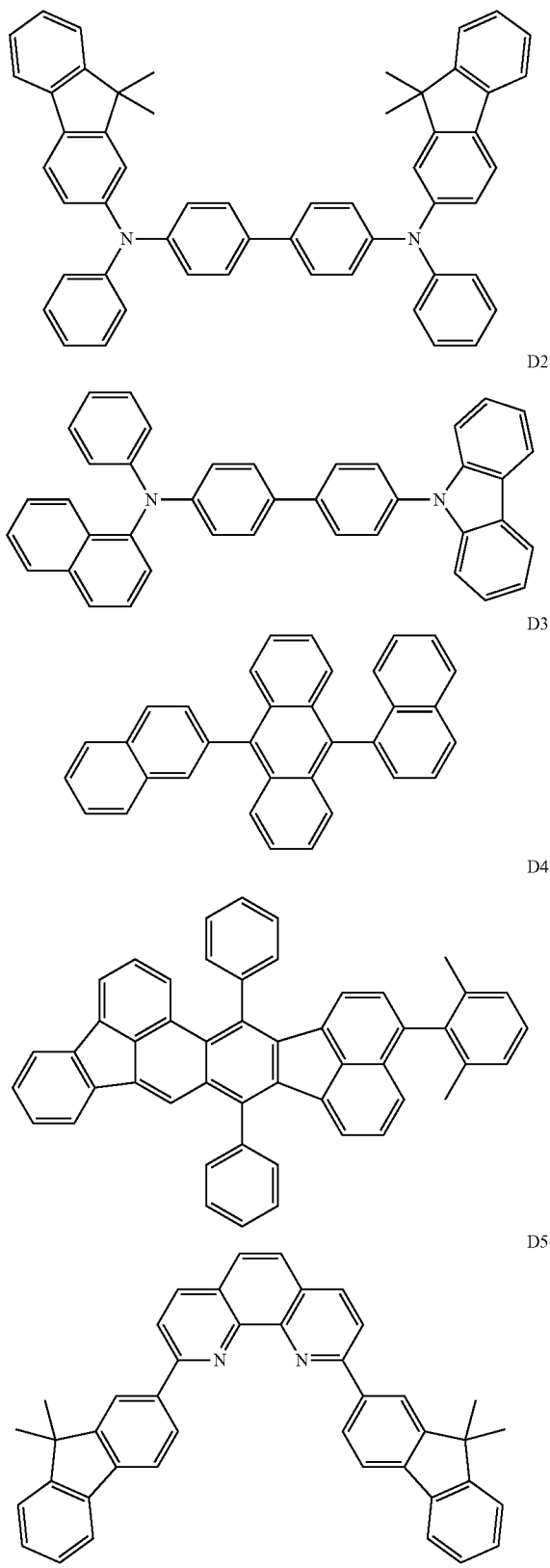

A specific method of producing the organic light-emitting device is described below.

ITO was formed into a film by a sputtering method on a glass substrate. Thus, the anode was formed. In this case, the thickness of the anode was set to 120 nm. The substrate on which the ITO electrode had been formed as described above was used as a transparent conductive supporting substrate (ITO substrate) in the following steps. Next, organic compound layers and electrode layers described in Table 1 below were continuously formed on the ITO substrate by vacuum vapor deposition through resistance heating in a vacuum chamber at $1 \times 10^{-5}$ Pa. In this case, an opposite electrode (a metal electrode layer or the cathode) was produced so as to have an area of 3 mm$^2$.

TABLE 1

| | Material | Thickness [nm] |
|---|---|---|
| Hole injection layer | D1 | 20 |
| Hole transport layer | D2 | 10 |
| Emission layer | Host: D3 Guest$^{(Note\ 1)}$: D4 | 30 |
| Hole/exciton blocking layer | Exemplified Compound A11 | 10 |
| Electron transport layer | D5 | 30 |
| First metal electrode layer | LiF | 1 |
| Second metal electrode layer | Al | 100 |

$^{(Note\ 1)}$A mixing ratio of the guest to the host: 2 wt %

The device characteristics of the resultant device were measured and evaluated. Specifically, its current-voltage characteristics were measured with a microammeter 4140B manufactured by Hewlett-Packard Company, and its emission luminance was measured with a BM7 manufactured by TOPCON CORPORATION. Table 2 shows the results of the measurement. It should be noted that the term "2% degradation lifetime" described in Table 2 refers to a time period required for its luminance to deteriorate by 2% as compared with the initial luminance when the organic light-emitting device was continuously driven at a constant current density of 25 mA/cm$^2$.

Examples 6 and 7

Organic light-emitting devices were each produced by the same method as that in Example 5 with the exception that the guest in Example 5 was appropriately changed to a compound described in Table 2. The device characteristics of the resultant devices were measured and evaluated in the same manner as in Example 5. Table 2 shows the results of the measurement.

Comparative Examples 1 and 2

An organic light-emitting device was produced by the same method as that in Example 5 with the exception that the guest in Example 5 was appropriately changed to a compound described in Table 2. The device characteristics of the resultant device were measured and evaluated in the same manner as in Example 5. Table 2 shows the results of the measurement. It should be noted that the structural formulae of Comparative Compounds R1 and R2 used respectively in Comparative Examples 1 and 2 are described below.

TABLE 2

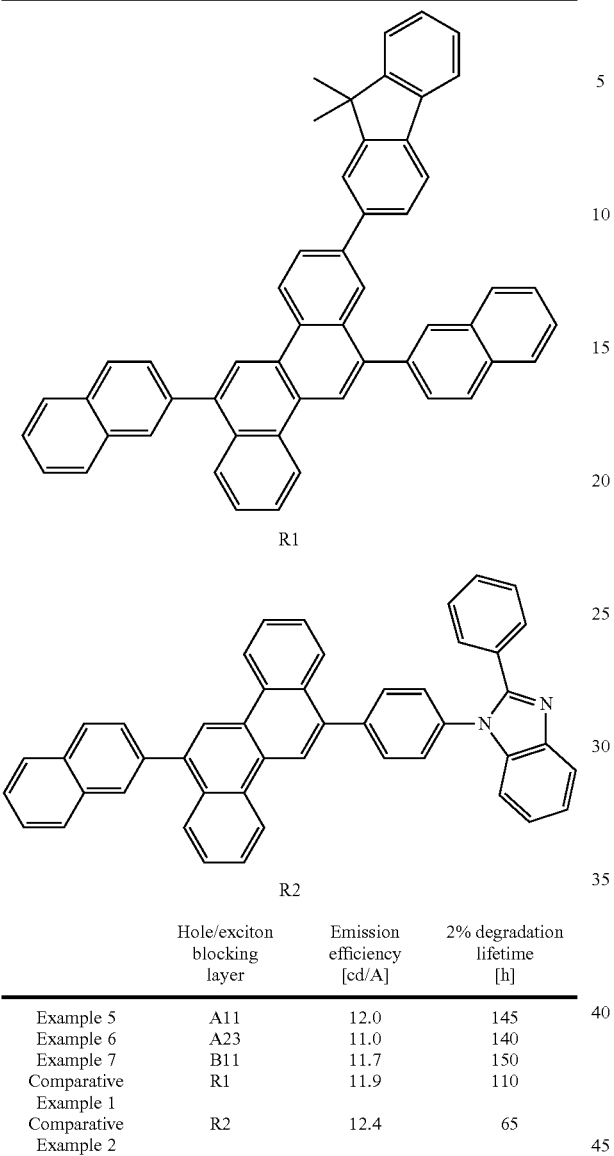

| | Hole/exciton blocking layer | Emission efficiency [cd/A] | 2% degradation lifetime [h] |
|---|---|---|---|
| Example 5 | A11 | 12.0 | 145 |
| Example 6 | A23 | 11.0 | 140 |
| Example 7 | B11 | 11.7 | 150 |
| Comparative Example 1 | R1 | 11.9 | 110 |
| Comparative Example 2 | R2 | 12.4 | 65 |

(Results and Discussion)

The 6,12-dinaphthylchrysene derivative of the present invention is an organic compound having a high glass transition temperature, a wide band gap, and a deep ionization potential, and when the compound is used as a component for an organic light-emitting device, a light-emitting device showing good emission efficiency, and at the same time, having particularly good durability can be provided.

REFERENCE SIGNS LIST

8: TFT element, 11: anode, 12: organic compound layer, 13: cathode While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-128251, filed Jun. 8, 2011, which is hereby incorporated by reference herein in its entirety.

What is claimed is:

1. A 6,12-dinaphthylchrysene derivative, comprising a compound represented by one of the following general formulae (1) and (2):

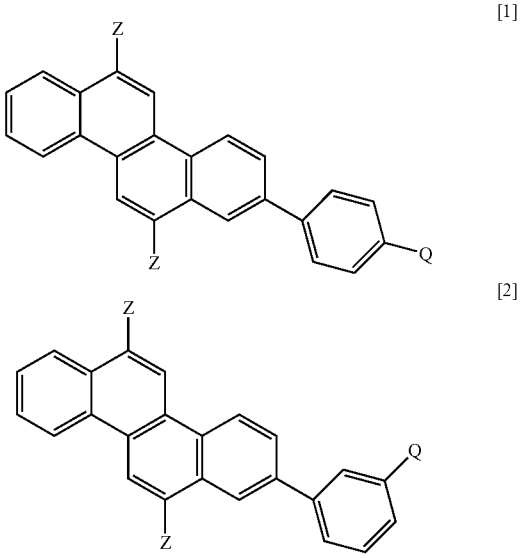

wherein in the formulae (1) and (2), Z represents a naphthyl group, and Q represents an electron-withdrawing substituent selected from the group consisting of the following general formulae (3) to (5):

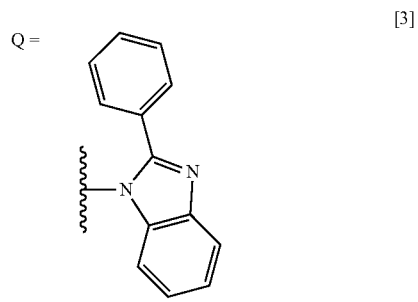

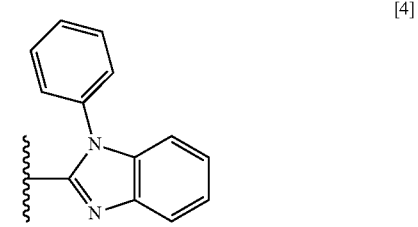

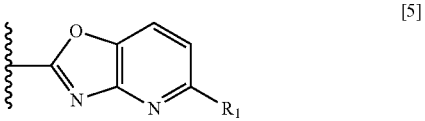

and wherein in the formula (5), $R_1$ represents one of a hydrogen atom and a methyl group.

2. The 6,12-dinaphthylchrysene derivative according to claim 1, wherein the derivative comprises a compound represented by any one of the following general formulae (6) to (9):

[6]
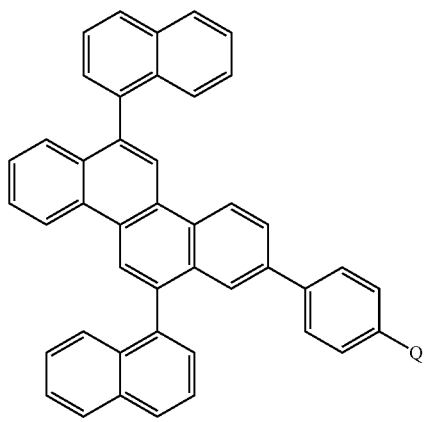

[7]
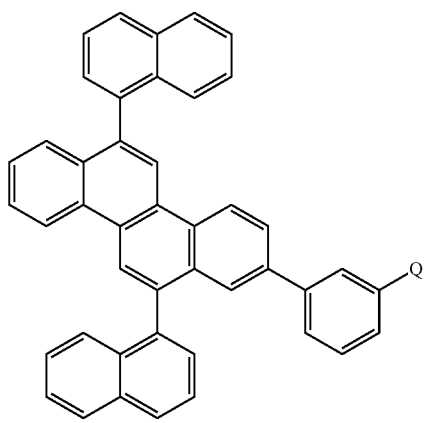

[8]
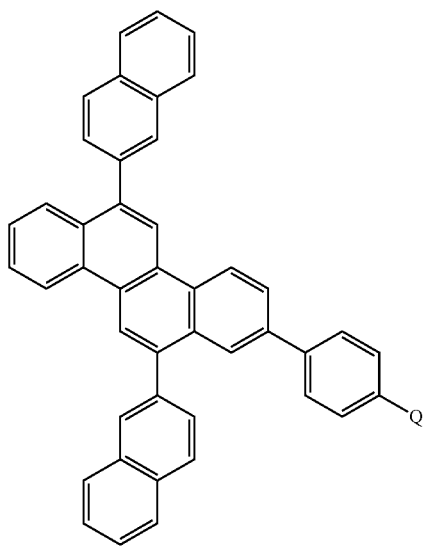

[9]
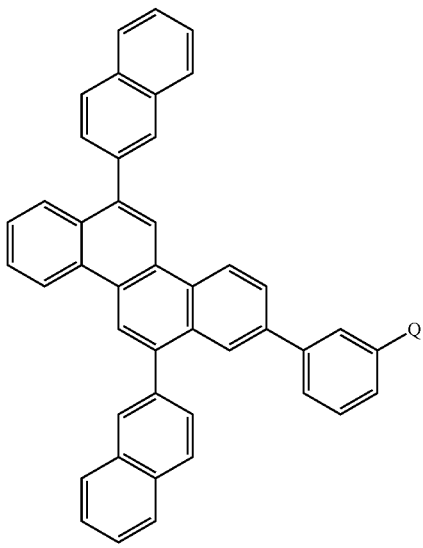

in the formulae (6) to (9), Q represents an electron-withdrawing substituent selected from the group consisting of the following general formulae (3) to (5):

Q =

[3]
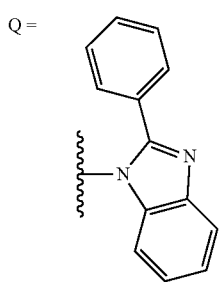

[4]
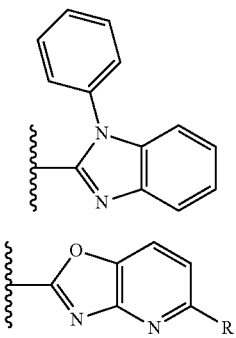

[5]
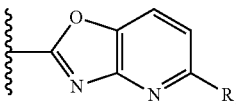

and wherein in the formula (5), $R_1$ represents one of a hydrogen atom and a methyl group.

3. An organic light-emitting device, comprising:
an anode;
a cathode; and
an organic compound layer disposed between the anode and the cathode,
wherein at least one layer of the organic compound layer has the 6,12-dinaphthylchrysene derivative according to claim 1.

4. The organic light-emitting device according to claim 3, wherein:

the organic compound layer has an emission layer, and an electron transport layer disposed between the emission layer and the cathode; and the electron transport layer has the 6,12-dinaphthylchrysene derivative.

5. The organic light-emitting device according to claim 3, wherein the organic compound layer has an emission layer, an electron transport layer disposed between the emission layer and the cathode, and a hole/exciton blocking layer disposed between the emission layer and the electron transport layer, and wherein the hole/exciton blocking layer has the 6,12-dinaphthylchrysene derivative.

6. A display apparatus, comprising a plurality of pixels, wherein the pixels each have the organic light-emitting device according to claim 3 and a switching element electrically connected to the organic light-emitting device.

7. An image input device, comprising:

a display portion for displaying an image; and an input portion for inputting image information, wherein the display portion has a plurality of pixels, and wherein the pixels each have the organic light-emitting device according to claim 3 and a switching element electrically connected to the organic light-emitting device.

8. A lighting equipment, comprising:

the organic light-emitting device according to claim 3; and an inverter circuit connected to the organic light-emitting device.

* * * * *